Oct. 6, 1964 A. V. BALCHAITIS 3,152,217

HEAT DISSIPATING SHIELD FOR ELECTRONIC COMPONENTS

Filed Dec. 1, 1960

INVENTOR.
ALBERT V. BALCHAITIS
BY
William A. Zalesak
Attorney

United States Patent Office 3,152,217

Patented Oct. 6, 1964

3,152,217
HEAT DISSIPATING SHIELD FOR ELECTRONIC COMPONENTS

Albert V. Balchaitis, Bellmawr, N.J., assignor to Radio Corporation of America, a corporation of Delaware Filed Dec. 1, 1960, Ser. No. 73,006
11 Claims. (Cl. 174—35)

This invention relates to shields for electronic components and has particular reference to a shield assembly which can be rigidly mounted on a component and is particularly well adapted for cooling an electronic component while shielding it from the effects of stray fields and radiations.

In many electronic circuits, it has been found necessary to provide grounded shields surrounding certain tubes and electronic components to isolate and shield them from stray electrostatic and magnetic fields produced by other circuit elements. Moreover, since the useful life and reliability of most of such components will be improved if they are cooled and prevented from overheating, it is the practice in many instances to utilize the shield for removing heat from the component as well as for shielding it from radiations. For effective and efficient cooling, it is generally necessary that the shield contact the electronic component so as to remove heat therefrom by conduction. One of the main disadvantages to the use of such shields, however, is that because of the contact of the shield to the component, vibrations of the shield are transmitted to the component which may result in distortion of the electrical signal therein, or damage to internal portions of the component such as the delicate electrodes of electron tubes.

One prior art shield, for example, comprises a circumferentially elastic cylinder formed from corrugated sheet metal of high thermal conductivity. The inner folds of the corrugations grip the sides of the electronic component and heat from the component is conducted into the shield and dissipated to the atmosphere. Although several means for securing such shields to the equipment chassis are known, it has been found that these means either do not adequately secure the shield to the chassis with sufficient firmness and rigidity to prevent harmful vibrations of the shields, or else have been so complicated as to impair widespread use thereof because of price.

An example of a prior art shield which is generally satisfactory with respect to reducing shield vibrations and with respect to reducing the effects of such vibrations on the shielded electronic component is a two piece shield assembly including an inner lining and an outer supporting sleeve. The inner lining is provided with a number of small spring fingers which contact the electronic component, and the outer sleeve is adapted to firmly support the inner lining and rigidly engage the socket in which the component is mounted. A disadvantage of this prior shield assembly is that the small spring fingers of the inner lining provide only a small component contacting and heat conducting area. Because of this, the heat dissipating capacity of the shield is restricted, and only a relatively small amount of tube cooling may be realized.

It is therefore an object of this invention to provide an improved shield construction which is simple and inexpensive to manufacture, which is particularly efficient with respect to the dissipation of heat from an electronic component, and which may be firmly attached to a component socket for reducing harmful vibrations of the shield and the electronic component.

A further object of this invention is to provide a shield which is adapted to accommodate a range of variations in electronic component dimensions, the shield nonetheless making firm contact to the component for effective conduction of heat therefrom.

A still further object of this invention is to provide a ruggedized electronic component shield assembly which is simple to assemble and which may be readily engaged to and detached from a component socket.

For accomplishing these and other objects in accordance with this invention, a shield assembly is provided which comprises an inner insert for contacting the electronic component and conducting heat therefrom and an outer tubular sleeve for receiving and supporting the insert and for making rigid attachment to a component socket.

The insert comprises a single sheet of elastic high thermal conductivity material formed as a hollow cylindrical member having a plurality of longitudinal return-bent folds or fins extending outwardly therefrom. Due to the elasticity of the material from which the insert is made and the outwardly extending fins, the insert is circumferentially expandible and contractable and may thus accommodate a range of component dimensions while still making firm contact to an electronic component received therein.

The outer sleeve is provided with a plurality of longitudinal cut-outs or slots in the wall thereof which extend from one end of the sleeve. A number of resilient fingers are thereby formed at the end of this member which are suitable for making firm and rigid attachment to a component socket as will be described hereinafter. An expandible clamping ring may be provided encompassing the outer sleeve adjacent the socket engaging end for firmly clamping the fingers to the socket. The slots are at least as long as the insert, and the two members are assembled by sliding the insert into the sleeve, the insert fins extending through and outwardly of the sleeve slots.

As will be described in detail hereinafter, advantages of this arrangement are that the component contacting insert is firmly supported within the outer sleeve, the outer sleeve may be easily and rigidly attached to a component socket, and a large component contacting and heat conducting area is provided by the finned insert for effective component cooling.

While the shield assembly of this invention has utility for shielding and cooling any one of many diverse electronic components, such as capacitors, tuning coils, and the like, it will be convenient to describe but one embodiment of the invention having utility for shielding and cooling electron tubes of the type known as miniature electron tubes.

Figure 1:
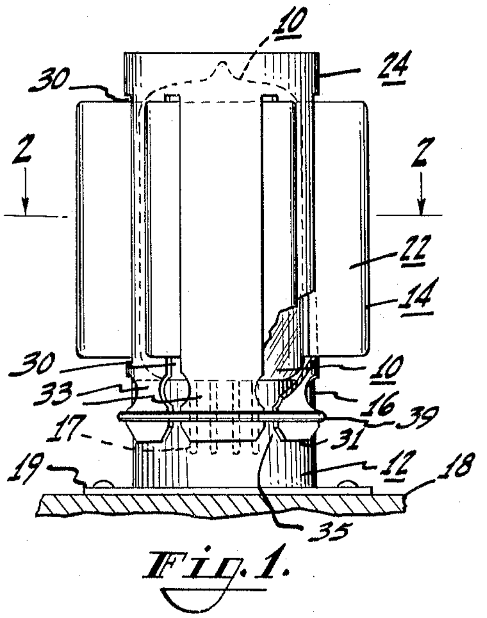
FIG. 1 is a view in elevation, partially broken away, of a shield assembly according to this invention mounted about a socketed electron tube.

The miniature type tube 10 of FIG. 1 comprises a straight-sided glass envelope having a plurality of lead-ins 17, extending downward of one end thereof for socketing the tube. The electron tube 10 is shown mounted in a tube socket 12, and a shield assembly 14 of this invention inserted over the tube 10 and rigidly fastened to an outer wall 16 of socket 12. Socket 12, in turn, is fastened to the equipment chassis 18 by a pair of extending ears 19 screwed to the chassis 18. Outer wall 16 supports a plate (not shown) having a number of apertures therein for receiving the lead-ins 17 of tube 10.

Figure 2:
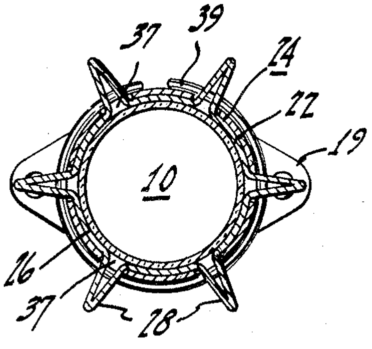
FIG. 2 is a sectional view taken along the line 2—2 of FIG. 1.

As shown in FIGS. 1 and 2, the shield assembly 14 comprises a finned insert 22 and a support sleeve 24. The purpose of insert 22 is to contact electron tube 10 and conduct heat therefrom, and the purpose of sleeve 24 is to receive and support insert 22 and to firmly mount the shield assembly 14 on socket 12.

Figure 3:
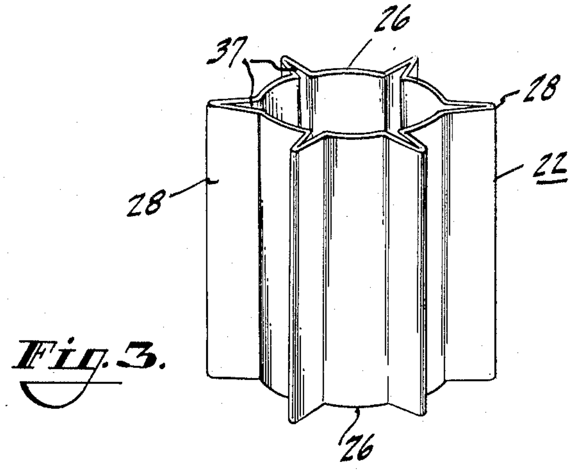
FIG. 3 is a view in perspective showing the insert portion of the shield assembly of FIGS. 1 and 2.

Insert 22 may be conveniently fabricated from a rectangular sheet of elastic high thermal conductivity material, such as molybdenum, which is formed into the finned cylindrical shape shown in FIG. 3. The fin-connecting wall portions 26 of insert 22 are shaped to conform to the circular cross section of tube 10, and the fins 28 are shaped to provide a large area for dissipating heat conducted from the insert wall portions 26 in contact with the tube to the atmosphere.

Inserts having cross sections conforming to the shape of non-straight sided devices such as certain types of electron tubes known as "octal" tubes, are also included within the spirit of this invention, but such inserts are more complicated and expensive to fabricate and hence less desirable than the simple insert illustrated herein. Likewise, fins having different shapes to provide greater heat dissipating areas may also be provided, if desired.

A feature of this invention is that insert 22 is circumferentially elastic and may thus accommodate tubes of varied sizes and dimensions while providing intimate contact of the insert to the tube envelope.

As shown in FIG. 3 fins 28 form a continuous part of the wall of insert 22 and the inner diameter of the insert may be increased by opening or stretching apart the side walls of the fins. Each formed fin serves as a spring, which opposes the opening of the fins, however, and a circumferential resiliency is thus imparted to the insert. The inner diameter of insert 22 is made slightly less than the diameter of the tube 10 to be shielded and cooled, and a slight enlargement of the insert occurs upon mounting over the tube 10. The stretched-apart fins tend to restore the insert to its original size whereby firm contact of wall portions 26 of the insert with the tube envelope is provided and efficient heat conduction from the tube to the insert is achieved. Moreover, because of the elasticity of the insert, the insert may readily accommodate tubes of varied dimensions and sizes, the insert stretching and generally following the periphery of the enclosed object.

The outer sleeve 24 for supporting insert 22 is likewise made from elastic high thermal conductivity material, such as molybdenum. The elasticity of the sleeve material facilitates attachment and detachment of the shield assembly from the socket as will be described, and the high conductivity of the material contributes to the dissipation of heat from the tube 10 by conducting heat from the insert 22 to the socket 12 and the chassis 18.

As shown in FIG. 1, sleeve 24 is shaped generally as a hollow, right circular cylinder having a plurality of longitudinal cut-outs, or slots 30 in the wall thereof. The slots 30 extend longitudinally from an end 31 of sleeve 24 and form a number of spring-like resilient flaps or fingers 33. End 31 of sleeve 24 has a diameter slightly less than that of outer wall 16 of socket 12, and upon mounting of the shield assembly 14 onto socket 12, fingers 33 are slightly flexed outwardly as sleeve 24 is pressed onto and around the socket wall 16. The resilient fingers 33 clamp tightly about wall 16, and a rigid fastening of the shield assembly 14 to the socket 12 is provided. The attachment of the shield assembly 14 to the socket 12 is sufficiently firm to prevent excessive vibration of the shield assembly, while the assembly may be easily removed from the socket by sliding it upwardly and off the socket wall.

The length of sleeve 24 is somewhat longer than the length of insert 22, and slots 30 extend longitudinally of sleeve 24 for a length sufficient to include the entire length of insert 22. The shield assembly is assembled prior to mounting about an electron tube 10 by registering each fin 28 with a slot opening 35 at the end 31 of sleeve 24, and inserting the insert into the sleeve. Wall portions 26 of insert 22 are enclosed by sleeve 24, while fins 28 extend through and outwardly of slots 30.

Upon subsequent mounting of the shield assembly 14 over an electron tube 10 and onto a tube socket 12, the width of neck 37 of fins 28 where the fins join wall portions 26 (FIGS. 2 and 3) is slightly enlarged to provide the necessary circumferential expansion of insert 22, as described. This increase in the width of the necks 37 serves to bind the fins 28 between the edges of slots 30, thereby providing an assembly including tube 10, insert 22, sleeve 24, and socket 12 in rigid, locked relationship.

Because of the long length of slots 30 necessary to receive fins 28, it may be found that fingers 33 are too flexible to provide a firm grip to socket 12. In this event, a spring clip or ring 39 may be provided, as shown in FIGS. 1 and 2, which encompasses sleeve 24 adjacent the socket engaging end 31 of sleeve 24 for squeezing fingers 33 tightly about socket 12.

What is claimed is:

1. An electronic component shield comprising an inner member having a plurality of fins extending outwardly therefrom, and an outer member having a plurality of openings and in contact with said inner member, said fins extending through said openings, said outer member including means for attaching said shield to said component.

2. An electronic component shield comprising an inner member adapted to encompass and contact an electronic component, and an outer member in contact with and supporting said inner member and adapted for securing said shield about said component, said inner member comprising a circumferentially elastic shield having a plurality of longitudinally extending folded fins extending outwardly therefrom, said outer member having a plurality of openings therethrough, and said fins extending through said openings.

3. An electronic component shield assembly comprising a high heat conducting inner member adapted to encompass and contact an electron component mounted in a socket, and an outer high heat conducting member supporting said inner member and adapted to secure said shield assembly to said socket, the wall of said inner member having folded longitudinal portions providing resiliently openable, outwardly extending fins which permit circumferential elastic expansion of said inner member, said outer member having a plurality of longitudinally extending openings therethrough, and said fins extending through said openings.

4. A heat conducting shield assembly for an electronic component mounted in a socket comprising a hollow, cylindrical inner member having wall portions for contacting said component for conducting heat therefrom, the wall portions of said inner member being formed to provide a plurality of longitudinal, outwardly extending heat dissipating fins and an outer member comprising a hollow cylindrical sleeve having a socket-engaging end and a plurality of slots therethrough extending longitudinally from said end, said fins extending through and outwardly of said slots.

5. A heat conducting shield assembly for an electronic component mounted in a component socket comprising a hollow, circumferentially elastic cylindrical inner member having wall portions for contacting said component for conducting heat therefrom, the wall portions of said inner member being formed to provide a plurality of longitudinal, outwardly extending heat dissipating fins, and an outer member substantially enclosing said inner member for support thereof, said outer member comprising a hollow cylindrical sleeve having a socket-engaging end and a plurality of slots therethrough extending longitudinally from said end, said slots being at least coextensive in length with said fins, and said fins extending through and outwardly of said slots.

6. A heat conducting shield assembly for an electronic component mounted in a socket comprising a hollow, cylindrical inner member having wall portions for contacting said component for conducting heat therefrom, the wall portions of said inner member being formed to provide a plurality of longitudinal, outwardly extending heat dissipating fins having, the return-bent sides of said fins being elastically separable permitting expansion of said inner member to accommodate a range of variations in component dimensions, and an outer member substantially enclosing said inner member for support thereof, said outer member comprising a hollow cylindrical sleeve having a socket-engaging end and a plurality of slots therethrough extending longitudinally from said end, said slots being at least coextensive in length with said fins permitting slidable relationship of said outer and said inner members for ease of assembly of said members, said fins extending through and outwardly of said slots.

7. A heat conducting shield assembly for an electronic component mounted in a socket comprising a hollow, cylindrical inner member having wall portions for contacting said component for conducting heat therefrom, the wall portions of said inner member being folded to provide a plurality of longitudinal, outwardly extending heat dissipating fins, said fins being resiliently openable permitting expansion of said inner member to accommodate a range of variations in component dimensions, the resiliency of said fins opposing the opening of said fins and tending to contract said inner member, whereby upon mounting and expansion of said inner member about a component, firm contact of said wall portions with said component is provided, and an outer member substantially enclosing said inner member for support thereof, said outer member comprising a hollow cylindrical sleeve having a socket-engaging end and a plurality of slots therethrough extending longitudinally from said end, said slots being at least coextensive in length with said fins permitting slidable telescoping relationship of said outer and said inner members for ease of assembly of said members, said fins extending through and outwardly of said slots, and a ring encompassing said outer member adjacent said end for clamping said outer member to said socket.

8. A heat dissipating accessory for electronic components comprising: an outer member having spaced slots through a portion thereof adapted to be placed over the envelope of an electronic component; a liner within at least said portion of said member, said liner having surfaces in contact with inner surfaces of parts on said member between said slots, the parts of said liner opposite said slots being return-bent outwardly and projecting through said slots to form heat dissipating fins extending outwardly of said member.

9. An electronic component shield assembly comprising a heat conducting inner member adapted to encompass and contact an electron component mounted on a socket, and an outer heat conducting member in contact with and supporting said inner member and having a socket engaging end for securing said shield assembly to said socket, said inner member having a plurality of fins extending outwardly therefrom, said outer member having a plurality of openings therethrough, and said fins extending through said openings.

10. A heat dissipating, electrical shield for electronic components comprising: an electrical and heat conducting member adapted to be placed over the envelope of an electrical component and having slots extending through a component enclosing portion thereof; and a liner within at least said portion of said member having portions engaging inner surfaces of the member between said slots so as to be pressed against the component envelope in good heat conducting relation therewith, the parts of said liner opposite said slots being return-bent outwardly and projecting through said slots to form heat dissipating fins extending outwardly of said member.

11. A heat dissipating, electrical shield for electronic components comprising: a generally tubular member having peripherally spaced, longitudinally extending slots therethrough and adapted to receive an electrical component therein; and a liner within said tubular member having peripheral portions engaging the inner surfaces of said tubular member between said slots, the portions of said liner between said peripheral portions being return-bent outwardly and projecting through the slots in said member to form heat dissipating fins extending outwardly of said member, said fins being of substantially V-shape and serving to greatly increase the heat dissipating capacity of the shield.

References Cited in the file of this patent

UNITED STATES PATENTS 354,892 Du Bois -------------- Dec. 28, 1886